(12) United States Patent
Jow et al.

(10) Patent No.: US 7,035,082 B2
(45) Date of Patent: Apr. 25, 2006

(54) STRUCTURE OF MULTI-ELECTRODE CAPACITOR AND METHOD FOR MANUFACTURING PROCESS OF THE SAME

(75) Inventors: Uei-Ming Jow, Tai Chung (TW); Chin-Sun Shyu, Ping Tung Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/895,113

(22) Filed: Jul. 21, 2004

(65) Prior Publication Data

US 2005/0157447 A1 Jul. 21, 2005

(30) Foreign Application Priority Data

Jan. 16, 2004 (TW) .............................. 93101289 A

(51) Int. Cl.
*H01G 4/228* (2006.01)

(52) U.S. Cl. .................... 361/306.3; 361/328; 361/760

(58) Field of Classification Search ............ 361/306.3, 361/308.3, 311–313, 321.2, 321.3, 328–329, 361/808–811, 760, 761, 766, 767

See application file for complete search history.

(56) References Cited

U.S. PATENT DOCUMENTS

| 4,985,926 | A | * | 1/1991 | Foster ......................... 381/77 |
| 5,079,069 | A | | 1/1992 | Howard et al. |
| 5,161,086 | A | * | 11/1992 | Howard et al. .......... 361/321.1 |
| 6,198,619 | B1 | * | 3/2001 | Fujioka ....................... 361/328 |

* cited by examiner

*Primary Examiner*—Anthony Dinkins
(74) *Attorney, Agent, or Firm*—Rabin & Berdo, P.C.

(57) ABSTRACT

A structure and method for manufacturing multi-electrode capacitor within a PCB is used to form a multi-electrode capacitor with a plurality of metal laminates coupled each other and employing the characteristics of the edge-coupled effect therein. the present invention can provide efficient capacitance from the capacitor with the smallest area. The present invention is applied to promote the capability of noise-restraint of the capacitive substrate in a high-frequency/speed system, and further achieves the purpose of regular circuit design with the smallest area in the future development.

6 Claims, 8 Drawing Sheets

STRUCTURE OF MULTI-ELECTRODE CAPACITOR AND METHOD FOR MANUFACTURING PROCESS OF THE SAME

BACKGROUND OF THE INVENTION

1. Field of the Invention

The present invention is used to form an efficient capacitance from a capacitor with the smallest area, in which the multi-electrode capacitor is includes a plurality of metal laminates coupled to each other and the characteristics of the edge-coupled effect therein is employed.

2. Description of Related Art

In modern high-frequency and high-speed printed circuit board (PCB) design with some specific functions like those including an IC substrate or a PC motherboard or some other communication systems, some capacitive elements will be added between the power end and the ground end for the purpose of filtering varying electric noise from the inner system or stabilizing electric voltage. The capacitive elements mentioned above are called a decoupling capacitor.

There are two main technologies of the capacitive elements used for decoupling, namely use of a discrete component capacitor, like the surface mount technology (SMT) capacitor, and use of a capacitive substrate developed recently for decoupling.

The methods for the discrete component and the capacitive substrate of the prior art described above have their own merits and demerits. Reference is made to the following description: the three main existing demerits of the discrete component module are (1) the working bandwidth is narrow; (2) the alternating resistance is not low enough; (3) the module cannot be integrated with the system in package. On the other hand, the three main demerits of the current capacitive substrate module are (1) the via parasitic effect is too big; (2) the module only has the design with two-dimension structure and the area is too big; (3) the electric loss of the module is large. Nevertheless, the PCB with capacitive substrate including the built-in components can be used for reducing the use of the passive elements as well as reducing cost, reducing the product volume, reducing the use of welding points, raising the reliability of the product and further promoting the electric characteristics of the passive elements.

The PCB employed in prior art often uses planar substrates with the same dielectric coefficient, such as glass reinforced epoxy (FR4) substrates, which have restrain noises poorly at high frequencies and have low integration of passive elements. U.S. Pat. No. 5,079,069, which is illustrated in FIG. 1, relates to a capacitor laminate for use in capacitive printed circuit boards and a method for manufacturing the same. Further improvement of the capacitive substrate is disclosed. A plurality of electrical components 12 is installed on a PCB 10, and both sides of the PCB 10 can be mounted with the active elements such as, for example, ICs, transistors or passive elements like capacitors and resistors. Usually, the PCB 10 is combined with one or a plurality of laminates including power layers, ground layers or other conductive material, and all kinds of elements thereon are connected with each other, or to the power source or ground.

The following description is pf the built-in capacitive substrate in substitution for previous capacitive elements on the PCB. The current PCB includes function other than conventional electric signal transmission, so many passive or active components are installed therein. Reference is made to the cross-sectional view of the PCB made of the built-in components shown in FIG. 2. The surface-mounted devices (SMD) 20 are mounted on the surface of PCB 10, in which the power wires 34 in the vertical direction and the ground wires 36 in the horizontal direction connect with the built-in capacitor 26 made of the first plate 28 and second plate 30 by way of these vias. The first plate 28 and the second plate 30 constitute the power end and the ground end, respectively (shown by the black spots in drawing), i.e. the plates 28, 30 are separated by a space at an interval and constitute the built-in capacitor 26 coupled with the power/ground ends and a dielectric 32 in the PCB 10. A signal wire 38 passes through the PCB 10 to be the wiring or signaling among the electrical components.

FIG. 3 shows the cross-sectional view of the multi-layer built-in capacitor in PCB corresponding to the drawing in FIG. 2. Separated, coupled, built-in capacitors 26 and 33 produce twice the former capacitance.

U.S. Pat. No. 5,161,086 discloses a structure used to gain higher capacitance through the specific surface treatment in the built-in capacitor shown-in FIG. 4. A built-in capacitor 41 is formed by two plates combined with a dielectric 42 within PCB 40. The surface treatment of the inner layers 43, 44 of the built-in capacitor 41 is used to change the characteristics of the plates for obtaining higher capacitance.

For the application of high-frequency analogy or digital hybrid electrical system, the lateral part of the multi-layer plates occupied within the PCB can be used to gain more capacitance.

The present invention discloses a structure and method for manufacture of multi-electrode capacitor and employs the edge-coupled effect from a plurality of metal laminates to provide efficient capacitance in the limited area within the PCB. Furthermore, the implementation of invention restrains the interference of noise at high frequencies and reduces the number of the wiring layers in a PCB, and promotes integration and reduces the volume of the system.

SUMMARY OF THE DISCLOSURE

It is an object of the present invention to employ the edge-coupled effect from a plurality of metal laminates forming the multi-electrode capacitor to provide efficient capacitance in the limited-area within the PCB.

The multi-electrode capacitor in PCB comprises a plurality of conducting layers formed the multi-electrode plates, which are separated by the spaces at an interval, and a plurality of vias, by which the conducting layers are connected to a plurality of surface-mounted devices, and a first plate. One of the plates and a second plate form a coupling capacitor, and the coupling capacitor includes a third plate, which is on the same conducting layer as the first plate, and a fourth plate, which is on the same conducting layer as the second plate.

The structure of multi-electrode capacitor comprises the steps of forming a first plate on a substrate by depositing or pressing, forming a second plate on said substrate by depositing or pressing, forming a plurality of plates with partial connection by etching said first plate, forming a first dielectric layer stacked on said first plate by depositing or pressing, and forming a plurality of vias on said first dielectric layer by laser drilling and plating metal into said vias.

BRIEF DESCRIPTION OF DRAWINGS

The present invention will be readily understood by the following detailed description in conjunction accompanying drawings, in which.

DETAILED DESCRIPTION OF THE PREFERRED EMBODIMENTS

To allow the Examiner to understand the technology, means and functions adopted in the present invention, reference is made to the following detailed description and attached drawings. The Examiner shall readily understand the invention deeply and concretely from the purpose, characteristics and specification of the present invention. Nevertheless, the present invention is not limited to the attached drawings and embodiments in following description.

Since the capacitive frequency for noise-restraint and voltage-stabilizing in PCBs is increasing and the volume is decreasing, the capacitive substrate is needed as the disclosure of the present invention. The present invention is used for obtaining better capacitance under the constraint of a limited area from the edge-coupled effect of plates and the coupling capacitance of the structure of a multi-electrode capacitor.

The basic equation describing capacitance is $C = \in A/D$, where C is capacitance, $\in$ is the dielectric constant, A is the effective area of capacitor, and also the area of the plate, and D is the distance between the two plates. The equation shows that the capacitance is proportional to the area of the plate and the dielectric constant, and inversely proportional to the distance between the two plates. Therefore, the capacitance can be increased by increasing the surface area of the capacitor, reducing the distance between the plates or adopting a dielectric material with a lower coefficient.

Reference is made to FIG. 5, which is a schematic drawing of the structure of a multi-electrode capacitor of the present invention. The structure is formed from a plurality of parallel conducting planes, and each conducting plane is etched into a plurality of plates and separated by the spaces at an interval as shown. There are four plates separately including a first plate 51, a second plate 52, a third plate 53 and a fourth plate 54, coupled two-by-two. The first plate 51 and the third plate 53 are the same conducting plane with the same electric potential, and the second plate 52 and the fourth plate 54 are the same conducting plane with the same electric potential, too. The capacitor is formed by the two parallel plates with the power and ground end respectively and connecting with the other conducting planes and a plurality of SMDs by way of the vias. A detailed description will be given with reference to FIGS. 6A to 6D of the present invention.

Figure 1:
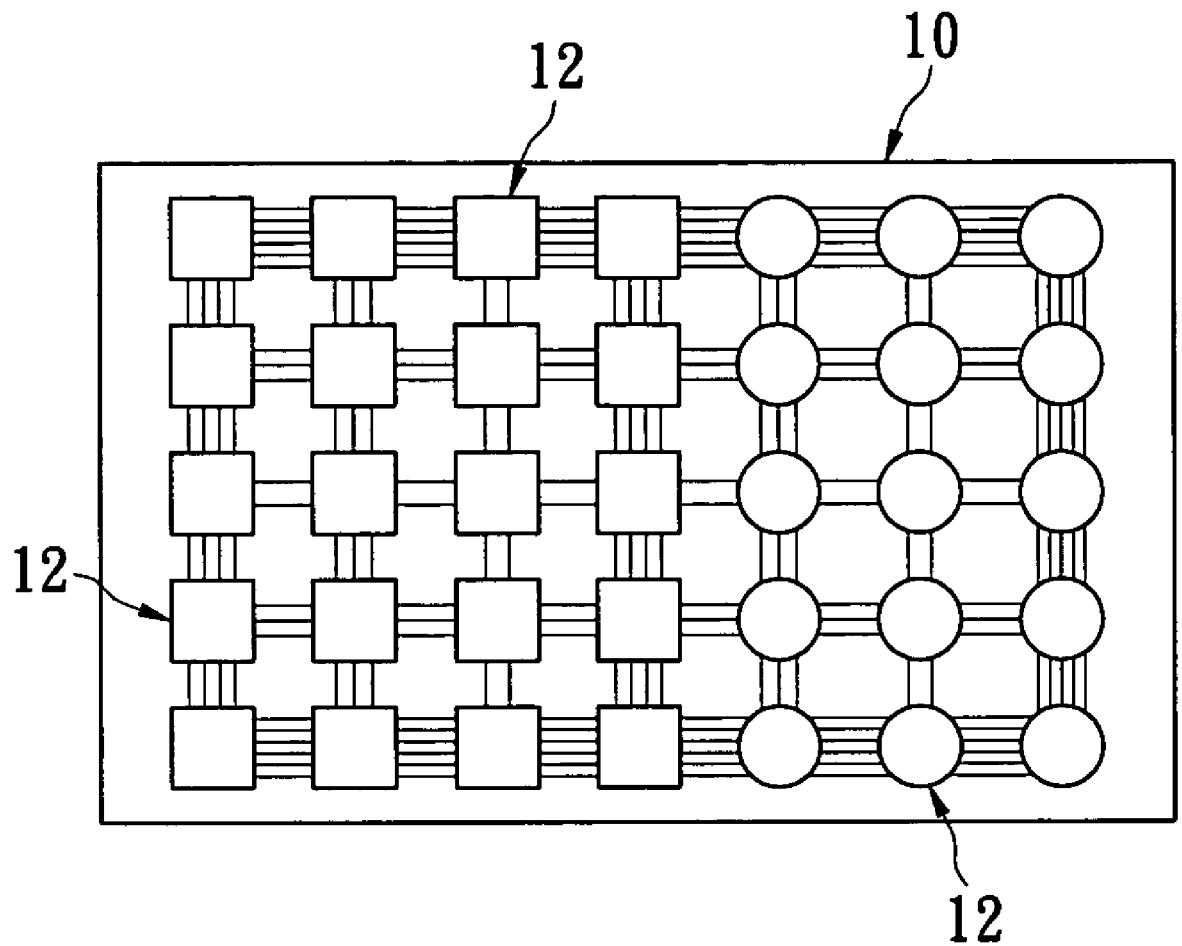
FIG. 1 is a schematic drawing of the printed circuit boards of the prior art.
Figure 2:
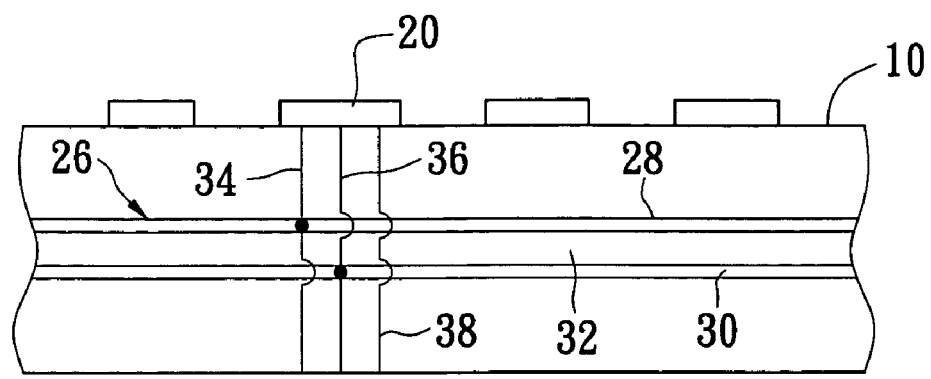
FIG. 2 illustrates a cross-sectional view of the PCB of the prior art.
Figure 3:
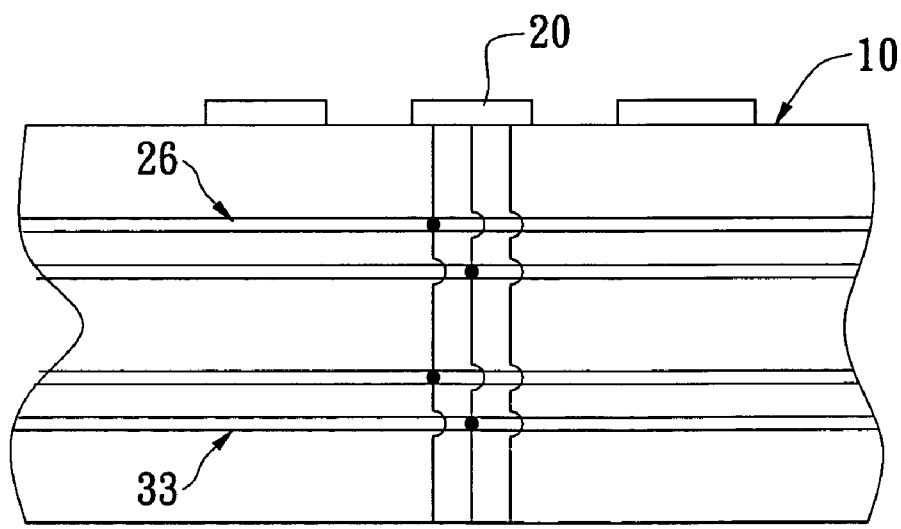
FIG. 3 illustrates a cross-sectional view of the multi-layer built-layer capacitor of the prior art.
Figure 4:
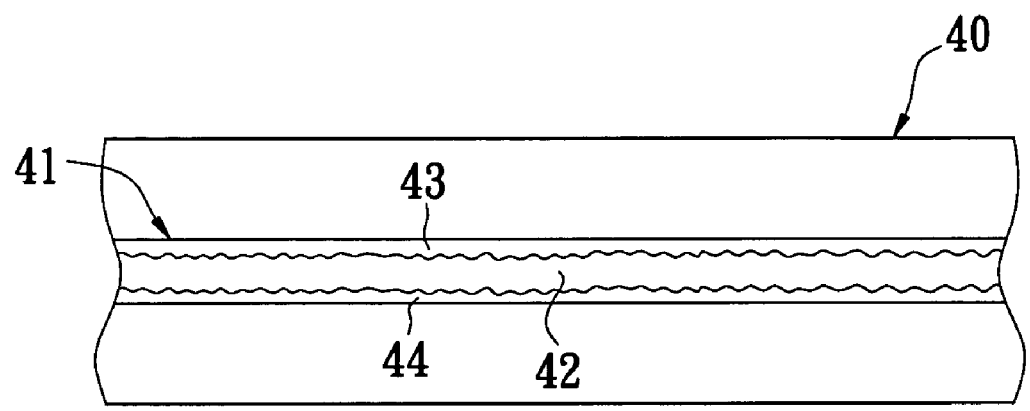
FIG. 4 is a schematic drawing of the surface treatment of the built-in capacitor of the prior art.
Figure 5A:
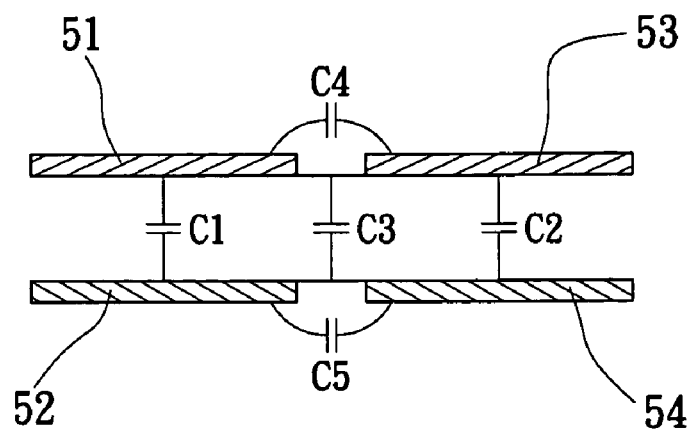
FIG. 5A is a schematic drawing of the structure of the present invention.

The first plate 51 and the second plate 52 shown in FIG. 5A constitute a first coupling capacitor C1, and the third plate 53 and the fourth plate 54 constitute a second coupling capacitor C2. The first coupling capacitor C1 and the second coupling capacitor C2 present an equivalent capacitor C3, that means the four plates mentioned above are equivalent to at least one equivalent capacitor C3. Furthermore, the adjacent plates in a certain separation will form another coupling capacitor due to the edge-coupled effect. The adjacent plates 51, 53 are of the same electric potential, and, in theory, should not produce a coupling capacitor therebetween. However, the parasitic coupling capacitor, produced due to the tiny potential difference therein, still exists.

A first edge-coupled capacitor C4 is formed by coupling with the first plate 51 and the third plate 53, and a second edge-coupled capacitor C5 is formed by the second plate 52 and the fourth plate 54. The effective capacitance in this embodiment is about the summation of the equivalent capacitor C3, the first edge-coupled capacitor C4 and the second edge-coupled capacitor C5 ($C \approx C3+C4+C5$).

The following description is of the edge-coupled capacitor. The area of the edge-coupled capacitor is the product of the width and the depth of the plate, and is also the area of edge of plate (A). Reducing the distance between the adjacent plates can reduce the coupling distance (D), so the edge-coupled capacitance increases and the total capacitance increases in the meanwhile. Otherwise, the edge-coupled capacitance is larger as when using the substrate with a high dielectric constant as the $\in$ quoted in the equation. Thus, the present invention is used to promote the total capacitance by using the edge-coupled characteristics of the multi-electrode capacitor.

The structure described in the invention can be stretched with replication.

Figure 5B:
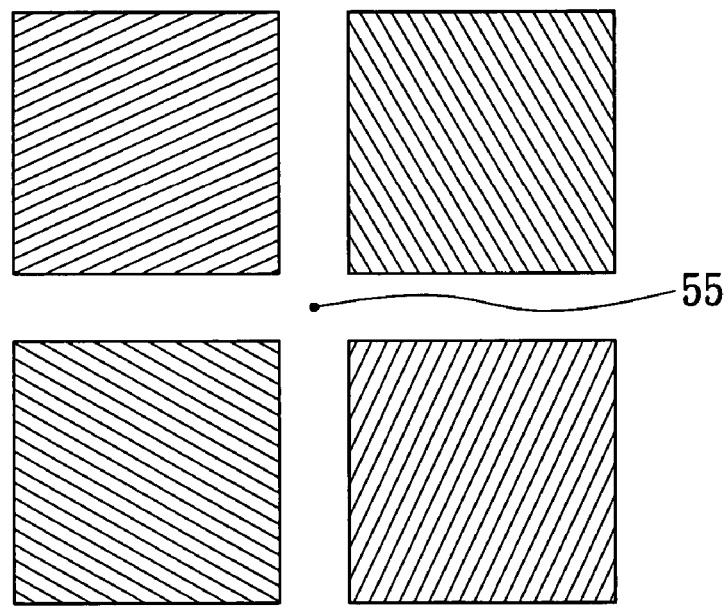
FIG. 5B is a schematic drawing of the structure of the invention.
Figure 5C:
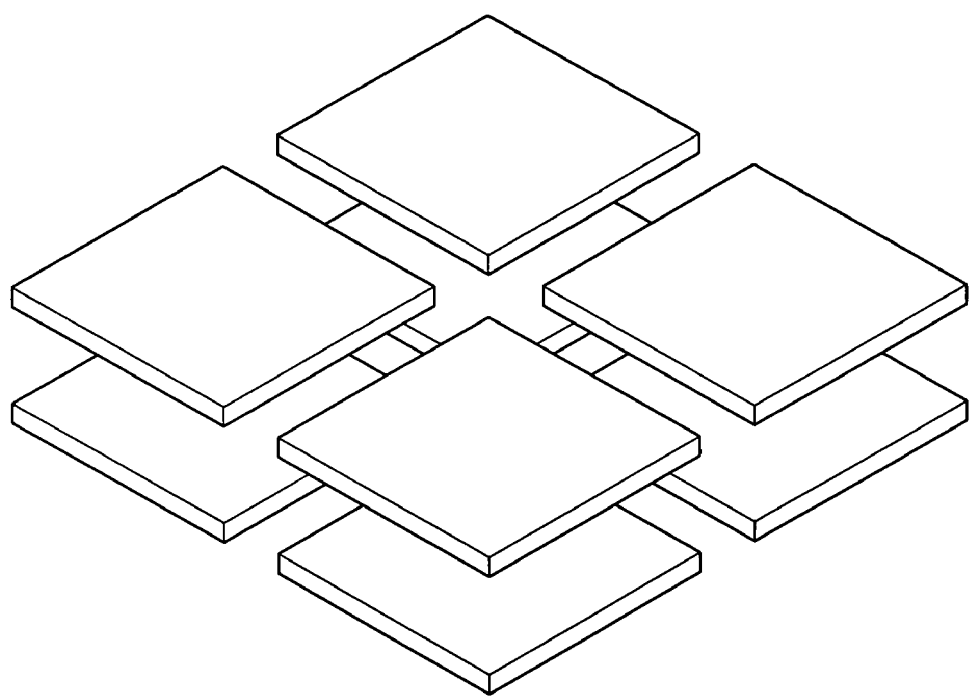
FIG. 5C is a 3-D view of the structure of the invention.

FIG. 5B shows the plane structure of the multi-electrode capacitor and FIG. 5C is the perspective view of the present invention. Four plates are shown in the drawing, installed parallel with each other, and each plate connects with the power end or the ground end. The electric field is produced within those plates. The four plates on the same conducting plane are connected with each other, and the one or a plurality of junction points of the power and ground end are preferably located at the intersection within the spaces between those plates, such as the junction point 55 shown in FIG. 5B. In order to increase the parasitic coupling capacitor in the present invention, not only is the coupling capacitor formed by the upper and under parallel plates, but also the edge-coupled capacitor is formed by the adjacent plates as well.

Figure 5D:
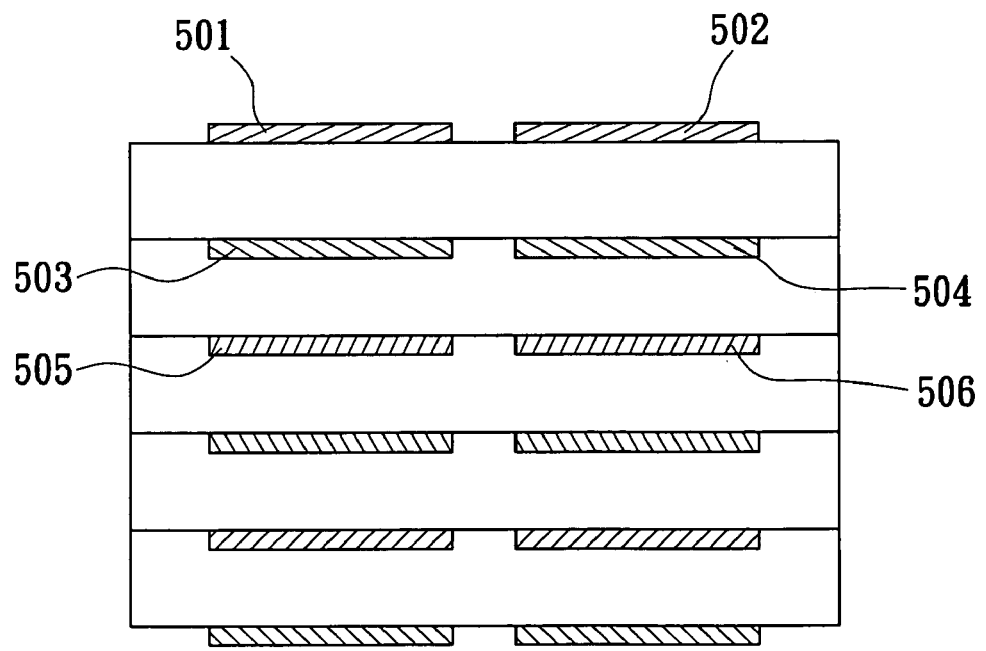
FIG. 5D is a schematic drawing of the multi-layer plates of the invention.

FIG. 5D shows the multi-electrode capacitor within the multi-layer plates for obtaining larger capacitance and shrinking the area of the multi-layer PCB. A plurality of plates is connected to the ground and power end and formed as upper and under electrodes or formed on the same plane with the multi-electrode type. The plate 501 and plate 502 are the plates on a plane, and separated by a specific distance between, so there will be an edge-coupled capacitor formed by the edge-coupled effect. The plate 503 and plate 504 are formed as the coupling capacitor oppositely, the plate 505 and the plate 506 parallel with the upper plates are formed as a coupling plate, and so on.

Figure 5E:
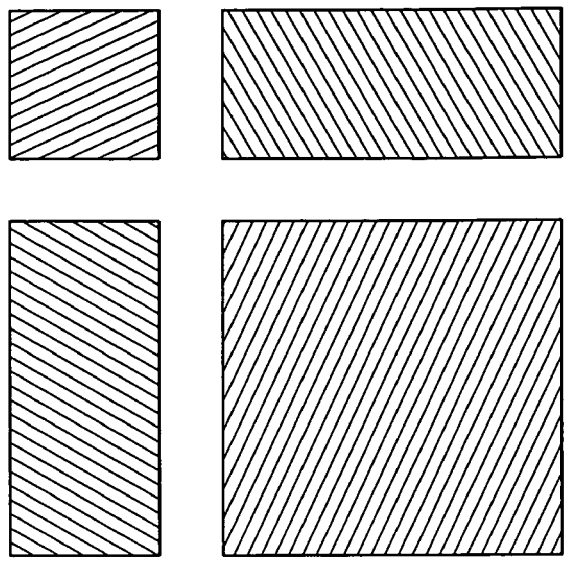
FIG. 5E illustrates a square, plate-shaped capacitor of the embodiment of the present invention.
Figure 5F:
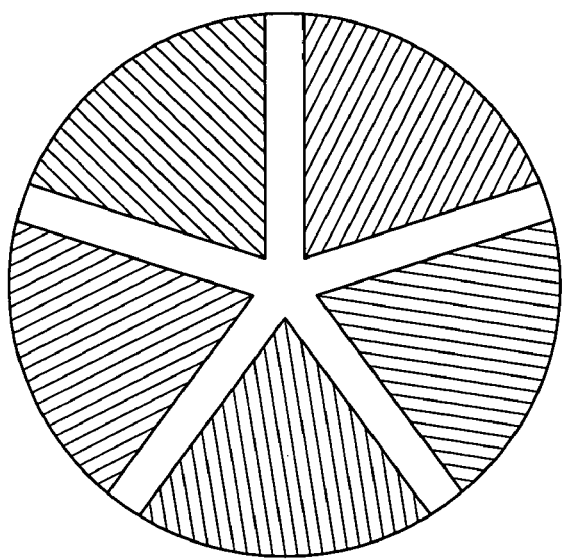
FIG. 5F illustrates a round, plate-shaped capacitor of the embodiment of the present invention.

Nevertheless, the plates can be implemented in any shape required, and the number of the slices of the plates can also be arbitrary. As shown in FIG. 5E, a built-in capacitor has a square, plate shape sliced into several parts with different sizes. FIG. 5D shows a built-in capacitor with a round, plate shape sliced into several parts with different sizes as required.

FIGS. 6A to 6D are schematic drawings of manufacturing a multi-electrode capacitor with a single port of the invention.

Figure 6A:
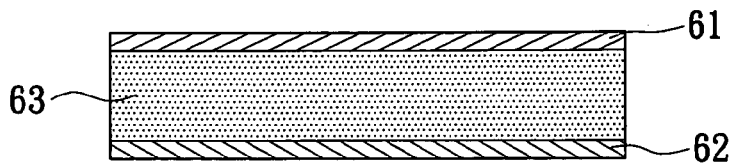
FIGS. 6A to 6D are schematic drawings of the manufacturing of a multi-electrode capacitor with a single port of the invention.

Reference is made to FIG. 6A, which shows the first step of depositing or plating a first plate 61 on a double-layer copper-foil substrate. The first plate 61 is a conducting plane, which can be a metal-insulator-metal (MIM) type layer, and connected to the power end. The second plate 62 is formed by depositing or plating a metal conducting layer, and connecting to the ground end in the current embodiment. A dielectric 63 is the insulator in the midst of these two plates.

Figure 6B:
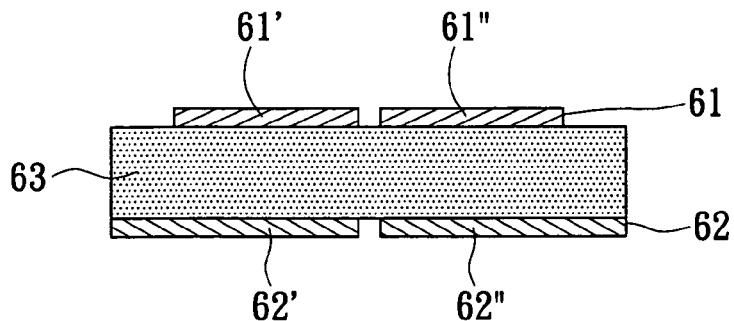

The second step shown in FIG. 6B is to etch the first plate 61 of the upper conducting plate to the size or shape as required, like the plates 61', 61", which are formed with the required distance therebetween and partially connected with each other on the same conducting plane by etching the first plate 61. The second plate 62 below is also be etched into a plurality of plates 62', 62" in opposite positions with a specific distance therebetween in proportion to the first plate 61. The under layer is bigger than the upper layer in the current embodiment of the built-in capacitor with a single port.

Figure 6C:
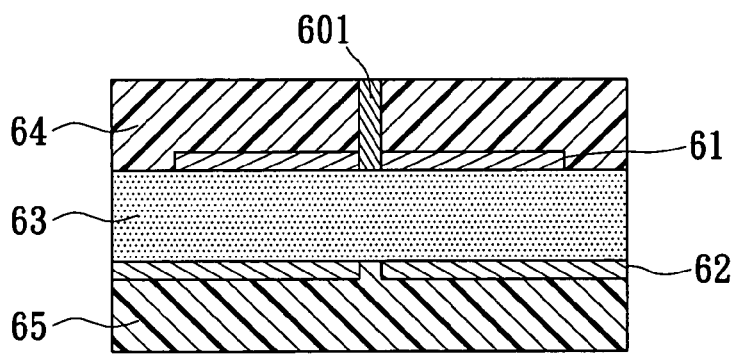

The third step shown in FIG. 6C is to form a first dielectric 64 above the etched plates 61', 61" and the dielectric layer 63 by depositing and pressing. Afterward a second dielectric layer 65 is deposited or pressed above the other side of the plates 61', 61" and the dielectric layer 63. For communicating with the outer devices, one or a plurality of vias are formed in the blind/buried holes by laser drilling the first dielectric layer 64, and the vias are used as the junction points connected to the built-in capacitor with the wires for connection. The vias are plated with metal to connect with the SMDs.

Figure 6D:
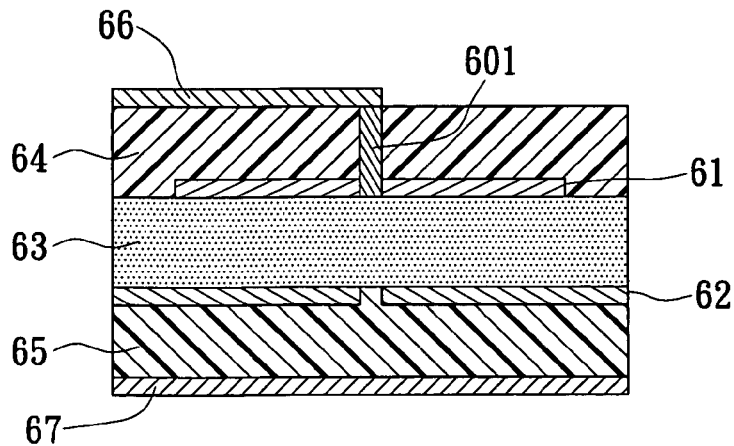

FIG. 6D shows the fourth step of the manufacturing process of the invention. Via 601 connected with the dielectric 63 is plated with metal for connecting with the upper routing layer 66 or the under routing layer 67 if necessary.

For achieving the structure of a multi-electrode capacitor with a multi-port, the present invention replicates the steps of the manufacturing process of the structure with a single port described above. Further, the edge-coupled effect formed between the electrodes can be used to increase the capacitance.

The embodiment of the present invention shown in FIGS. 7A to 7D is about the manufacturing process of the structure of a multi-electrode capacitor with double ports.

Figure 7A:
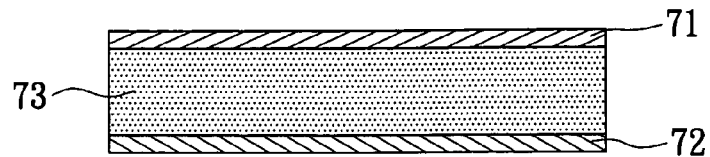
FIGS. 7A to 7D are schematic drawings of the manufacturing of a multi-electrode capacitor with double ports of the invention.

The first step is shown in FIG. 7A. An upper plate 71 is formed above a dielectric layer 73 of the substrate with a double-layer copper foil by depositing, plating and pressing. The upper plate 71 is a metal conducting layer, which is considered the upper plate 71 of the structure of metal-insulator-metal (MIM). Further, the under plate 72 is formed on the other side of the dielectric layer 73 by the method of depositing, plating and pressing. The upper plate 71 and the under plate 72 connect with the power and ground end, respectively, in this embodiment; the layer in the midst of the structure is the insulated dielectric layer 73.

Figure 7B:
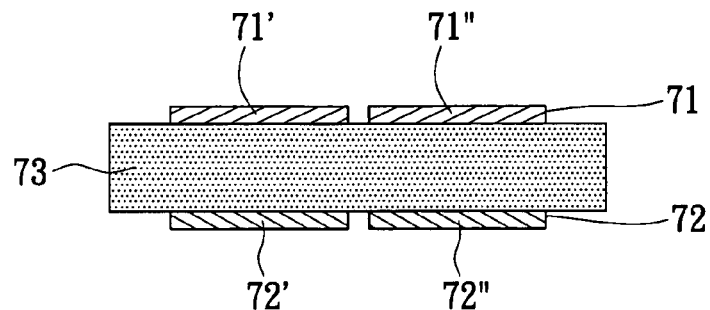

FIG. 7B shows the second step of the process. The upper plate 71 on the upper conducting layer is etched into the size or shape as required, and further etched into a plurality of plates 71', 71" at a required distance apart. The under plate 72 on the under ground layer is also etched into a plurality of plates 72', 72" with a position opposite the first plate 71 and a required distance therebetween. Therefore, a plurality of plates is formed on the upper and under plane. The embodiments described above are not limitations of the implementation of the present invention.

Figure 7C:
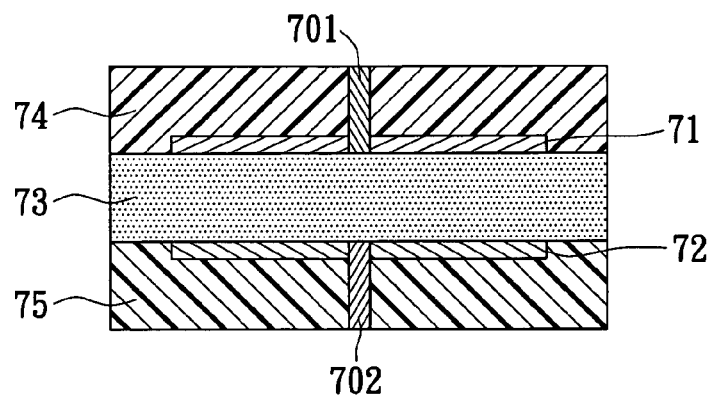

The third step is shown in FIG. 7C, which describes an upper dielectric layer 74 formed above the etched plates 71', 71" and the dielectric layer 73 by the method of depositing or pressing. An under dielectric layer 75 is also formed on the other side of the plates 72', 72" and dielectric layer 73 by depositing or pressing. A blind or buried via 701 is drilled in upper dielectric layer 74 by laser drilling, and via 702 is drilled in the under dielectric layer 75. The vias 701, 702 will be the junction points between the built-in capacitor and wires for connection. The vias are plated with metal for making connection with the SMDs.

Figure 7D:
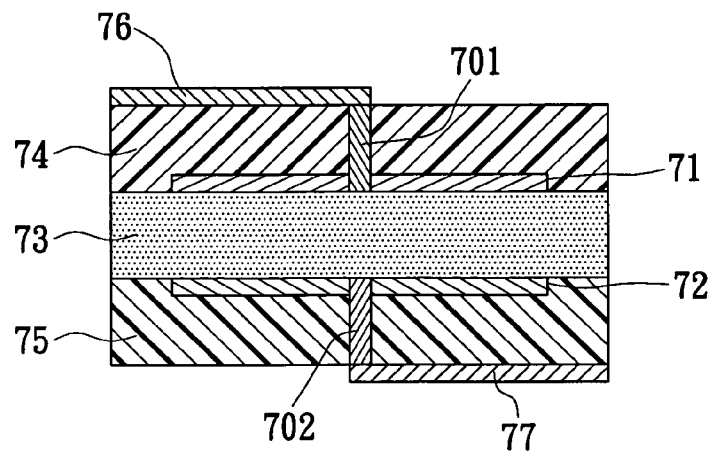

FIG. 7D shows the fourth step of the manufacturing process of the structure. Via 701 connecting the dielectric layer 73 is plated with metal for connecting with a plurality of plates 71', 71" of the built-in capacitor and further the upper routing layer 76. On the other side, the via 702 connecting the dielectric layer 73 is plated with metal for connecting with a plurality of plates 72', 72" of the built-in capacitor and further the under routing layer 77. The via 701 and the via 702 connecting the electrodes of the built-in capacitor are used to form a structure with double ports.

For achieving the structure of a multi-electrode capacitor with multi-ports, the present invention also repeats the steps of the manufacturing process of the structure with double ports described with reference to FIGS. 7A to 7D. Further, the edge-coupled effect formed between the electrodes can be used to increase the capacitance.

In particular, the present invention relates to a structure and method for manufacturing the multi-electrode capacitor and employs the characteristics of the edge-coupled effect from the separated metal laminates of the built-in capacitor to increase the capacitance in a limited area. Furthermore, the implementation can restrain the interference from noise at high frequencies and reduce the routing wires required on the PCB for promoting the integral density of the PCB system.

The many features and advantages of the present invention are apparent from the written description above and it is intended by the appended claims to cover all. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A structure of multi-electrode capacitor, comprising:
   a plurality of spaced-apart conducting layers, each conducting layer being comprised of a plurality of electrode plates, the electrode plates of each respective conducting layer being separated from each other by spaces; and
   a plurality of vias connecting with said conducting layers and a plurality of surface-mounted devices;
   wherein the separated electrode plates of each respective conducting layer produce an edge-coupled effect to thereby increase a capacitance in a limited area of a PCB.

2. The structure of multi-electrode capacitor as recited in claim 1, wherein said structure of the multi-electrode capacitor is formed by replicating a plurality of capacitors.

3. The structure of multi-electrode capacitor as recited in claim 2, wherein said capacitors are formed by said plates coupled with each other.

4. The structure of multi-electrode capacitor as recited in claim 1, wherein said plates are made of metal.

5. A multi-electrode capacitor, comprising:
   a plurality of conducting layers forming a plurality of multi-electrode plates, separated by spaces at an interval within; and
   a plurality of vias connecting with said conducting layers and a plurality of surface-mounted devices;
   wherein one or a plurality of junction points of said vias are located at an intersection of said spaces within said plates.

6. A multi-electrode capacitor, comprising:
   a plurality of conducting layers forming a plurality of multi-electrode plates, separated by spaces at an interval within; and
   a plurality of vias connecting with said conducting layers and a plurality of surface-mounted devices;
   wherein one or a plurality of junction points of said vias are located on said conducting layers.

* * * * *